United States Patent
Katayama et al.

(10) Patent No.: US 8,475,923 B2
(45) Date of Patent: Jul. 2, 2013

(54) HEAT TRANSFER FILM, SEMICONDUCTOR DEVICE, AND ELECTRONIC APPARATUS

(75) Inventors: Masako Katayama, Tokyo (JP); Hidemichi Fujiwara, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 1322 days.

(21) Appl. No.: 12/232,470

(22) Filed: Sep. 17, 2008

(65) Prior Publication Data

US 2009/0190312 A1 Jul. 30, 2009

(30) Foreign Application Priority Data

Jan. 25, 2008 (JP) .................................. 2008-015463

(51) Int. Cl.
- *B32B 9/00* (2006.01)
- *B32B 9/04* (2006.01)
- *B32B 13/04* (2006.01)
- *B32B 27/32* (2006.01)
- *B32B 19/00* (2006.01)
- *H05K 7/20* (2006.01)
- *H01L 23/34* (2006.01)
- *F28F 7/00* (2006.01)

(52) U.S. Cl.
USPC ............ 428/408; 165/185; 257/712; 361/704; 361/705; 361/708; 428/220; 428/446; 428/448; 428/701; 428/702

(58) Field of Classification Search
USPC .................. 361/704, 705, 708; 428/408, 220, 428/446, 448, 701, 702; 257/712; 165/85
See application file for complete search history.

(56) References Cited

U.S. PATENT DOCUMENTS

| | | | | |
|---|---|---|---|---|
| 5,241,131 A | * | 8/1993 | Bakhru et al. | 174/15.1 |
| 5,247,203 A | * | 9/1993 | Shigihara et al. | 257/713 |
| 5,296,310 A | * | 3/1994 | Kibler et al. | 428/614 |
| 5,947,710 A | * | 9/1999 | Cooper et al. | 418/63 |
| 6,599,400 B2 | * | 7/2003 | Strondl et al. | 204/192.15 |
| 2005/0260419 A1 | * | 11/2005 | Hukari et al. | 428/428 |

FOREIGN PATENT DOCUMENTS

| | | |
|---|---|---|
| JP | 06-21280 A | 1/1994 |
| JP | 10-247708 A | 9/1998 |
| JP | 2001-315246 A | 11/2001 |
| JP | 2002-322555 A | 11/2002 |
| JP | 2003-168882 A | 6/2003 |
| JP | 2006-229174 | * 8/2006 |

OTHER PUBLICATIONS

Machine english translation of JP 2006-229174, published Aug. 31, 2006, provided by the JPO website, Internet retrieval date of Dec. 17, 2012.*

* cited by examiner

*Primary Examiner* — Jonathan Langman
(74) *Attorney, Agent, or Firm* — Kubotera & Associates LLC

(57) ABSTRACT

A heat transfer film includes a heat transfer layer formed of a first constituent material containing C (carbon) for transferring heat in an in-plane direction thereof and a layer thickness direction thereof; and a strain relaxation layer formed of a second constituent material and laminated on the heat transfer layer for relaxing a strain in the heat transfer layer. The first constituent material includes a graphite, and the second constituent material includes an amorphous material.

7 Claims, 14 Drawing Sheets

HEAT TRANSFER FILM, SEMICONDUCTOR DEVICE, AND ELECTRONIC APPARATUS

BACKGROUND OF THE INVENTION AND RELATED ART STATEMENT

The present invention relates to a heat transfer film, a semiconductor device, and an electronic apparatus comprising the heat transfer film. The heat transfer film, the semiconductor device, and the electronic apparatus are used in an electronics field and a vehicle waste heat management field, in which it is necessary to efficiently transfer heat generated in the electronic apparatus and the semiconductor device.

Conventionally, in a case of radiating or transporting heat generated by a semiconductor device, such as an electronic apparatus, an electronic device, an optical device, or the like, heat transport is performed through heat exchange with a liquid or transferring heat to a material with a high thermal conductivity. For example, a single layer is formed of a graphite material as a heat conducting material.

Patent Reference has disclosed an anisotropic heat conducting material comprised of a combination of a thermal resonant material and a material with a high thermal conductivity as an inner layer thereof. Accordingly, the anisotropic heat conducting material has a heat insulation property in a layer thickness direction thereof and a high thermal conductivity in an in-plane direction thereof.

Patent Reference: Japanese Patent Publication No. 2006-229174

Further, conventionally, in order to cool a semiconductor device, i.e., an optical device such as a semiconductor laser diode, a light emitting diode, or the like, and an electronic device such as a MOS type field effect transistor, a heterojunction type field effect transistor, or the like, a heat sink is attached thereto, or heat is transferred to a substrate thereof. In a case of a single laser chip, a heat sink comprised of a material with a high thermal conductivity such as Cu, Al, or the like is provided for radiating heat. In a case of a semiconductor element such as an Si chip or the like, and a module thereof, a heating element or the like is provided for radiating heat of a heated element to a substrate via a lead.

When the heat exchange with a liquid is performed for radiating or transferring heat generated in the semiconductor device or the like, it is necessary to provide a heat transfer module of an evaporation and cohesion type such as a heat pipe or the like having a heat transport path with a limited direction, a limited dimension or a limited configuration. Accordingly, it is difficult to reduce a size of a device with the heat transfer module, thereby making it difficult to cool a portable device with a small space.

When a component with a high thermal conductivity is provided in a device for transferring heat, heat is dissipated through a heat transfer process. Accordingly, it is difficult to transfer a sufficient amount of heat. Further, heat tends to dissipate or diffuse in the heat transfer process, thereby causing a harmful effect on the device.

In the conventional technology disclosed in Patent Reference, an object thereof is to suppress the thermal conductivity in the layer thickness direction to obtain the anisotropic heat conducting material, rather than through improving the thermal conductivity in the in-plane direction thereof. Accordingly, it is difficult to substantially improve the thermal conductivity.

In view of the conventional problems described above, an object of the present invention is to provide a heat transfer film capable of efficiently radiating and transporting heat generated in a heating element in a limited space. Another object of the present invention is to provide a semiconductor device and an electronic apparatus comprising the heat transfer film.

SUMMARY OF THE INVENTION

In order to attain the objects described above, according to a first aspect of the present invention, a heat transfer film comprises a heat transfer layer formed of a first constituent material containing C (carbon) for transferring heat in an in-plane direction thereof and a layer thickness direction thereof, and a strain relaxation layer formed of a second constituent material and laminated on the heat transfer layer for relaxing a strain in the heat transfer layer.

In the first aspect, the heat transfer layer is formed of the first constituent material including C (carbon) for transferring the heat in the in-plane direction and the layer thickness direction thereof, and the strain relaxation layer is formed of the second constituent material for relaxing the strain in the heat transfer layer, and is laminated on the heat transfer layer. Accordingly, it is possible to improve a degree of crystallinity of the first constituent material, thereby improving an thermal conductivity thereof in the in-plane direction.

As a result, it is possible to obtain the heat transfer layer having an extremely thin thickness and an extremely high thermal conductivity in the in-plane direction thereof. Further, it is possible to effectively transfer heat generated in a heating element such as a semiconductor device or the like through the heat transfer layer. Therefore, it is possible to obtain the heat transfer film capable of efficiently radiating and transporting heat generated in a heating element within a limited space.

Further, it is possible to dissipate and diffuse a small amount of heat in a heat transfer process, and to transport a sufficient amount of heat in the in-plane direction. Accordingly, it is possible to minimize a harmful effect on an device due to dissipation and diffusion of heat in the heat transfer process.

Further, it is possible to efficiently radiate heat from an electronic apparatus and a semiconductor device used in such an electronics field as a vehicle waste heat management field or the like, in which it is necessary to efficiently transfer heat generated in a heating element. Further, it is possible to cool a portable device with a limited space.

According to a second aspect of the present invention, in the heat transfer film, the heat transfer layer is formed a graphite as the first constituent material. When the graphite is an HOPG (a high oriented pyrolytic graphite) with excellent crystallinity, it is possible to obtain a high heat conductivity between 1500 and 2000 W/mK. When the graphite is a nano carbon, it is possible to obtain a further high heat conductivity of about 3000 W/mK.

In the second aspect, the heat transfer layer is formed of the graphite as the first constituent material, and the strain relaxation layer formed of the second constituent material is laminated on the heat transfer layer for relaxing the strain in the heat transfer layer. Accordingly, it is possible to increase a degree of crystallinity of the graphite, thereby improve heat conductivity of the heat transfer layer. Further, it is possible to obtain the heat transfer layer having an extremely small thickness and a extremely high thermal conductivity in the in-plane direction thereof.

According to a third aspect of the present invention, in the heat transfer film, the strain relaxation layer is formed of an amorphous material as the second constituent material.

In the third aspect, the amorphous material is used as the second constituent material. Accordingly, it is possible to improve a degree of crystallinity of the first constituent material, thereby improving heat conductivity of the heat transfer layer in the in-plane direction thereof.

According to a fourth aspect of the present invention, in the heat transfer film, the heat transfer layer and the strain relaxation layer are laminated alternately at least one time. Accordingly, it is possible to improve a heat conductivity (an inner layer heat conductivity) of the heat transfer layer in the in-plane direction thereof, and to obtain a sufficient heat transport amount in the in-plane direction. In particular, when the heat transfer layer and the strain relaxation layer are laminated alternately at a plurality of times, it is possible to obtain a multilayered layer configuration, in which the heat transfer layer is inserted between the strain relaxation layers. Accordingly, it is possible to improve further the inner layer heat conductivity of the heat transfer layer.

According to a fifth aspect of the present invention, in the heat transfer film, the heat transfer layer has a layer thickness d and the strain relaxation layer has a layer thickness t, so that the following relation is established:

$$0.4 \leq d/(d+t) \leq 0.8$$

Here, $d/(d+t)$ is a ratio of the layer thickness of the heat transfer layer to a total layer thickness of the heat transfer film, or a ratio of a layer thickness of the first constituent material to a total layer thickness of the first constituent material and the second constituent material. In other words, $d/(d+t)$ is a ratio of the layer thickness d of the heat transfer layer (the first constituent material) to the layer thickness $(d+t)$ of the heat transfer layer and the strain relaxation layer in a laminated state.

When the ratio $d/(d+t)$ is smaller than 0.4, that is, the ratio of the first constituent material is small, the heat transfer layer becomes smaller and is difficult to relax a strain therein, thereby making it difficult to improve a degree of crystallinity of the first constituent material. Further, it is difficult to improve heat conductivity of the heat transfer layer in the in-plane direction.

When the ratio $d/(d+t)$ is greater than 0.8, that is, the ratio of the first constituent material is large, crystallinity of the first constituent material lowers, thereby making it difficult to improve heat conductivity of the heat transfer layer in the in-plane direction.

In the fifth aspect, the ratio $d/(d+t)$ is set within the range between 0.4 and 0.8, thereby sufficiently relaxing the strain in the heat transfer layer. Accordingly, it is possible to improve a degree of crystallinity of the first constituent material and to improve heat conductivity of the heat transfer layer in the in-plane direction. Thus, it is possible to obtain the heat transfer having an extremely small thickness and an extremely high thermal conductivity in the in-plane direction.

According to a sixth aspect of the present invention, in the heat transfer film, the layer thickness d of the heat transfer layer and the layer thickness t of the strain relaxation layer are within a range between 1 nm and 20 nm, respectively.

When the graphite (C) is used as the first constituent material, a mean free path of a phonon becomes longer due to a lower dimensional structure thereof. Accordingly, it is possible to obtain further high heat transfer characteristics such as 3000 W/mK due to the nano carbon. Therefore, when the graphite is formed in a thinner layer, it is possible to improve heat conductivity thereof due to the lower dimensional structure. However, in an actual case, it is difficult to obtain high heat conductivity only through making the graphite a thinner layer. In order to improve the inner layer heat conductivity of the heat transfer layer, it is necessary to improve a degree of crystallinity of the graphite formed in the thinner layer.

In the sixth aspect, the layer thickness d of the heat transfer layer and the layer thickness t of the strain relaxation layer are set within the range of not thinner than 1 nm but not thicker than 20 nm, respectively. Accordingly, it is possible to improve a degree of crystallinity of the first constituent material (the graphite, for example), and to improve the inner layer heat conductivity of the heat transfer layer. The second constituent material (an Si layer) such as an amorphous Si or the like of the strain relaxation layer relaxes a strain in the first constituent material (the graphite layer) of the heat transfer layer.

When the layer thickness d of the heat transfer layer is smaller than 1 nm, that is, the graphite layer is excessively thin, a nuclear of graphite tends generate directly on the strain relaxation layer, thereby making it difficult to improve a degree of crystallinity of the graphite layer. When the layer thickness d of the heat transfer layer is greater than 20 nm, that is, the graphite layer is excessively thick, graphite is deposited on an graphite layer with high orientation to disturb crystallinity thereof.

For the reasons described above, the layer thickness d of the heat transfer layer is preferably within the range of not thinner than 1 nm but not thicker than 20 nm. Moreover, it is preferable for the layer thickness d of the heat transfer layer to be within a range of not thinner than 3 nm but not thicker than 15 nm.

When the layer thickness t of the strain relaxation layer is smaller than 1 nm, that is, the second constituent material (the Si layer) is excessively thin, the strain relaxation layer is difficult to cover undulation of the heat transfer layer, and then another heat transfer layer may be formed before the strain relaxation layer is flattened, thereby deteriorating a relaxation function thereof. When the layer thickness t of the strain relaxation layer is greater than 20 nm, the layer thickness d of the heat transfer layer also becomes excessive as corresponding to the layer thickness t of the strain relaxation layer. Accordingly, the crystallinity of the heat transfer layer worsens as described above, thereby deteriorating the relaxation function thereof.

For the reasons described above, the layer thickness t of the strain relaxation layer is preferably within the range of not thinner than 1 nm but not thicker than 20 nm for the. Moreover, it is preferable for the layer thickness t of the strain relaxation layer to be within a range of not thinner than 3 nm but not thicker than 15 nm.

According to a seventh aspect of the present invention, the heat transfer layer may be formed of at least one of an amorphous Si, an amorphous Ge, an amorphous SiGe, an amorphous $SiO_2$, an amorphous SiOx, and an amorphous $TiO_2$.

In the seventh aspect, the heat transfer layer is formed of at least one of the amorphous Si, the amorphous Ge, the amorphous SiGe, the amorphous $SiO_2$, the amorphous SiOx, and the amorphous $TiO_2$ as the second constituent material. Accordingly it is possible to improve the crystallinity of the first constituent material through relaxing a strain in the first constituent material, and to improve the inner layer heat conductivity of the heat transfer layer.

According to an eighth aspect of the present invention, a semiconductor device comprises a semiconductor element and the heat transfer layer formed on the semiconductor element or in the semiconductor element.

In the eighth aspect, when the semiconductor device generates heat, it is possible to transfer heat preferentially toward a side face through the heat transfer layer. Accordingly, it is possible to increase a total heat radiation amount, and to reduce a temperature of the semiconductor device.

In the eighth aspect, the semiconductor device may include a light emitting diode as the semiconductor element, and the heat transfer layer is provided near an active layer of the light emitting diode. In this case, it is possible to transfer heat generated in the active layer preferentially toward a side face through the heat transfer layer. Accordingly, it is possible to increase a total heat radiation amount, and to reduce a temperature of the semiconductor device.

In the eighth aspect, the semiconductor device may include a semiconductor laser diode as the semiconductor element, and the heat transfer layer is provided near an active layer of the semiconductor laser diode. In this case, it is possible to transfer heat generated in the active layer preferentially toward a side face through the heat transfer layer. Accordingly, it is possible to increase a total heat radiation amount, and to reduce a temperature of the semiconductor device.

In the eighth aspect, the semiconductor device may include a plurality of semiconductor laser diodes arranged with aligning; a condensing lens for condensing outgoing beams from the semiconductor laser diodes; a cooling unit; and a plurality of the heat transfer layers arranged and sandwiching the semiconductor laser diodes. The semiconductor device is configured as a laser diode module for processing, in which heat is transferred from the semiconductor laser diodes toward the cooling unit.

In this case, the heat transfer layers are arranged and sandwich the semiconductor laser diodes. Accordingly, it is possible to transfer heat generated in active layer of the semiconductor laser diodes preferentially toward a side face through the heat transfer layers. Accordingly, it is possible to increase a total heat radiation amount, and to reduce a temperature of the semiconductor device.

In the eighth aspect, the semiconductor device may include the semiconductor element and the heat transfer layer such that the heat transfer layer transfers heat generated in the semiconductor element toward an edge part of the heat transfer layer. In this case, it is possible to transfer and release heat generated in the semiconductor element toward the edge part, and to reduce a temperature of the semiconductor element.

In the eighth aspect, the semiconductor device may include a plurality of the semiconductor elements arranged and stacked in a package, and the heat transfer layer is formed on a top surface or a bottom surface of the semiconductor elements. In this case, when heat is generated in the semiconductor elements, it is possible to release heat toward an edge part through the heat transfer layer formed on the top surface or the bottom surface of the semiconductor elements, and to reduce a temperature of all of the semiconductor elements.

According to a ninth aspect of the present invention, an electronic apparatus comprises an electric component and the heat transfer layer formed on the electronic component or in the electric component. In this case, it is possible to efficiently transfer heat in the electronic component such as a semiconductor device arranged in a limited small space through the heat transfer layer with an extremely small thickness.

In the ninth aspect, the electronic apparatus may include an automobile control device. In this case, it is possible to efficiently transfer heat in the electronic component arranged in a limited small space through the heat transfer layer with an extremely small thickness.

According to the present invention, the semiconductor device may include a semiconductor element and the heat transfer layer. In this case, it is possible to transfer and release heat in a transistor layer of the semiconductor element through the heat transfer layer in a layer in-plane direction thereof.

According to the present invention, the semiconductor device may include a silicon (Si) substrate; the heat transfer layer formed on the silicon substrate; a silicon oxide layer formed on the heat transfer layer; and a transistor layer formed on the silicon oxide layer.

According to the present invention, the semiconductor device may include a silicon substrate; a silicon (Si) layer formed at a central part of the silicon substrate; and the heat transfer layers formed at both sides of the silicon layer and connected to the silicon substrate via the silicon (Si) layer.

According to the present invention, the semiconductor device may include a silicon substrate and the heat transfer layer formed on a whole surface of the silicon substrate.

According to the present invention, the semiconductor device may include a silicon (Si) substrate; the heat transfer layer formed on the silicon substrate; and a transistor layer formed on the heat transfer layer.

According to the present invention, the semiconductor device may include a silicon substrate; a silicon (Si) layer formed at a central part of the silicon substrate; and the heat transfer layers formed at both sides of the silicon layer and connected to the silicon substrate via the silicon (Si) layer.

In the present invention, it is possible to obtain the heat transfer layer with an extremely small thickness and an extremely high thermal conductivity in the in-plane direction thereof. Accordingly, it is possible to effectively transfer heat generated in the heating element such as the semiconductor device through the heat transfer layer. Therefore, it is possible to efficiently radiate and transfer heat generated in the heating element within a limited space.

In the present invention, it is possible to dissipate and diffuse a small amount of heat in a heat transfer process in the in-plane direction. Accordingly, it is possible to reduce a harmful effect on an electric device due to dissipation and diffusion of heat in the heat transfer process. Further, it is possible to cool the electronic apparatus and the semiconductor device used for such as an electronics field, a vehicle waste heat management field, or the like, in which it is necessary to efficiently transfer heat generated in the semiconductor device or the like. Still further, it is possible to cool a portable device in a limited space.

In the present invention, it is possible to efficiently radiate and transport heat generated in a limited space through the heat transfer layer. Accordingly, it is possible to provide the semiconductor device with a small size capable of efficiently radiating transporting heat. Further, it is possible to cool a portable device such as a portable telephone or the like.

DETAILED DESCRIPTION OF THE PREFERRED EMBODIMENTS

Embodiments of the present invention will be described in detail below, based on the drawings.

First Embodiment

Figure 1:
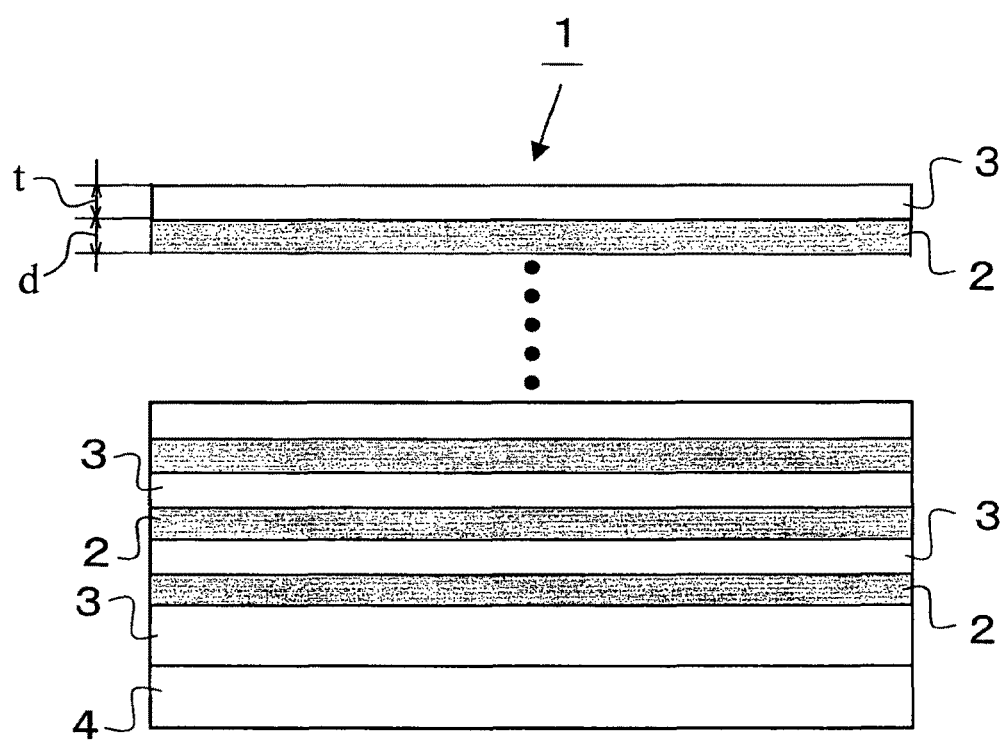
FIG. 1 is a cross sectional view showing a heat transfer layer according to a first embodiment of the present invention.
Figure 2:
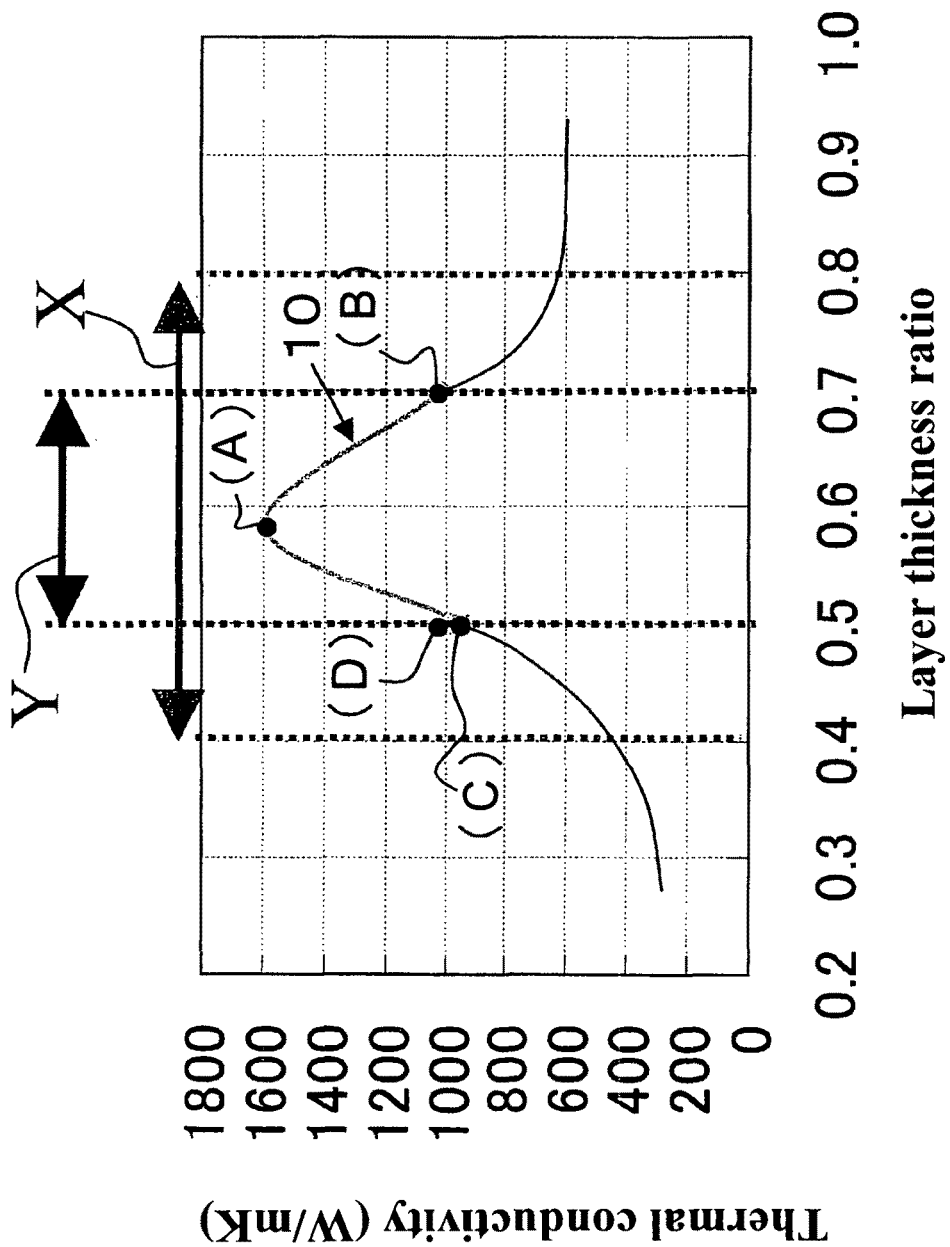
FIG. 2 is a graph showing a relation between a layer thickness ratio and a thermal conductivity in an in-plane direction.
Figure 3:
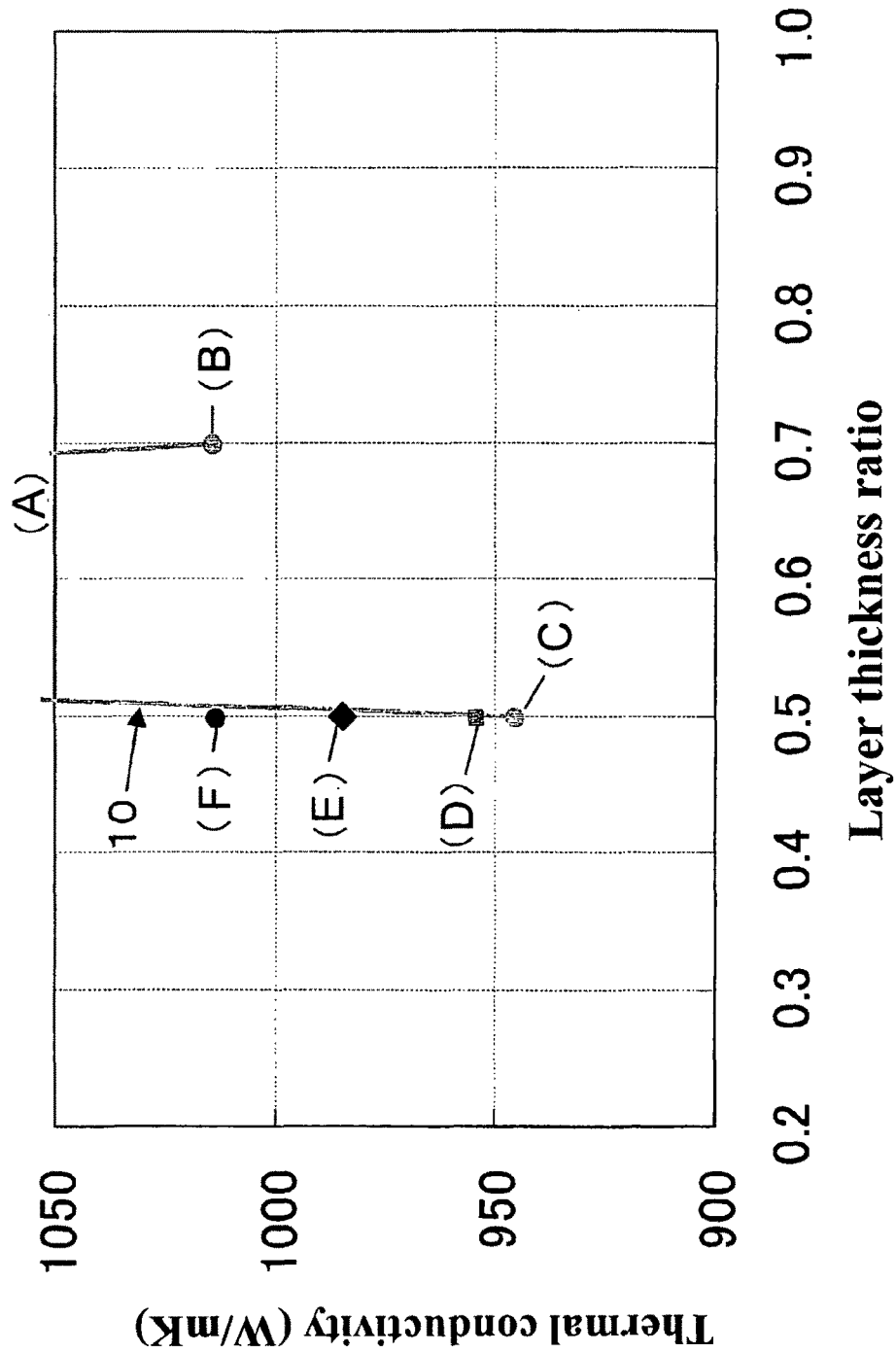
FIG. 3 is a partially enlarged graph of FIG. 2.
Figure 4:
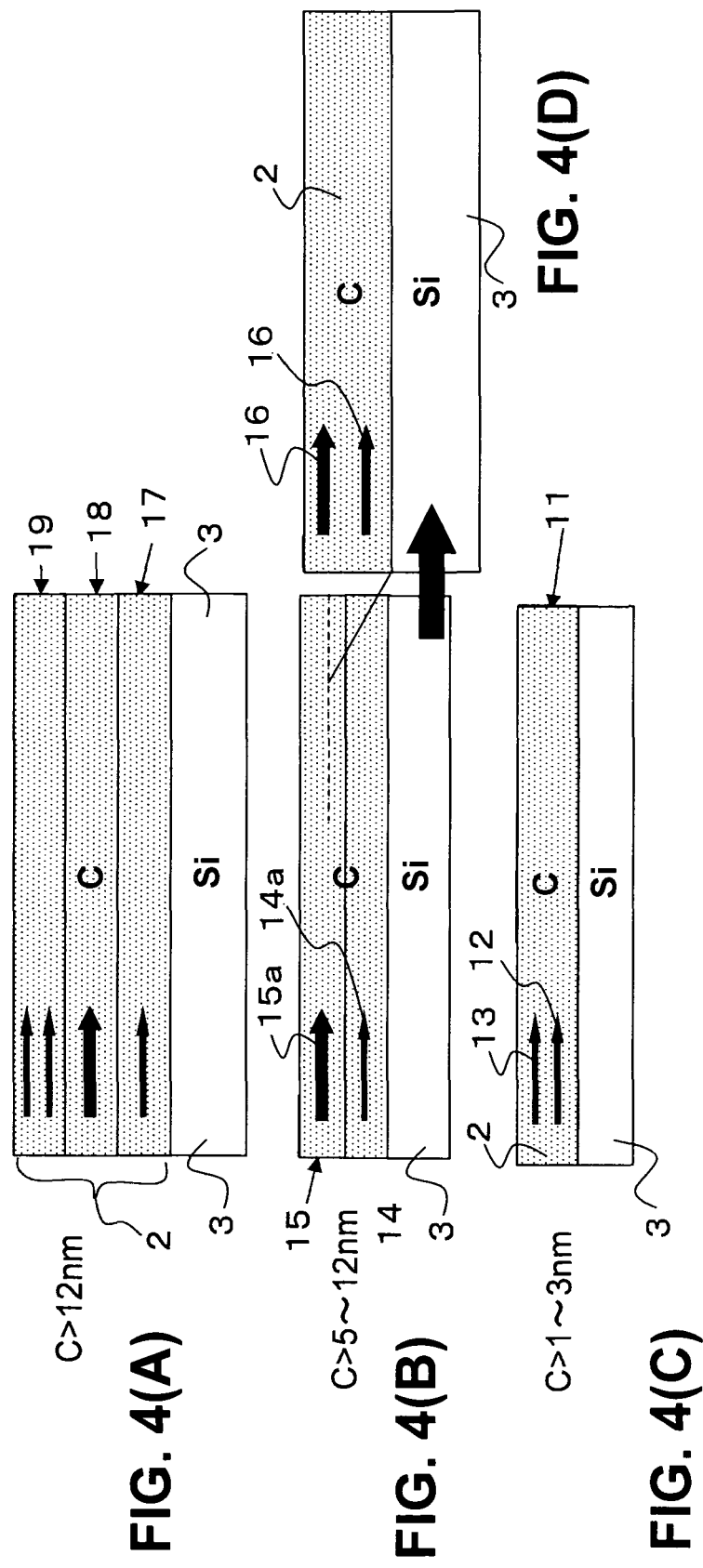
FIGS. 4(A) to 4(D) are schematic views showing a mechanism of heat transfer enhancement by optimizing a configuration of a layer thickness.

A first embodiment of the present invention will be described in detail below, based on FIG. 1 to FIG. 5. FIG. 1 is a cross sectional view showing a heat transfer layer according to the first embodiment, FIG. 2 is a graph showing a relation between a layer thickness ratio and a thermal conductivity in in-plane direction, FIG. 3 is a partially enlarged graph of FIG. 2, and FIGS. 4(A) to 4(D) are views showing a mechanism of a heat transfer enhancement by optimizing a configuration of a layer thickness.

A heat transfer layer 1 as shown in FIG. 1 is configured by stacking a heat transfer layer 2 comprised of a first constituent material as a material including C (carbon) for transferring heat in in-plane direction and a layer thickness direction, and a strain relaxation layer 3 comprised of a second constituent material for relaxing a strain of the first constituent material. Here, a symbol 4 designates a silicon (Si) substrate.

According to the heat transfer layer 1, a graphite is selected as the first constituent material of the heat transfer layer 2. Here, it may be not necessary for the graphite to be completely crystallized as a crystal of a hexagonal plate shape, i.e., a so-called graphite.

Moreover, an amorphous material is selected as the second constituent material of the strain relaxation layer 3. For example, any one of an amorphous Si, an amorphous Ge, an amorphous SiGe, an amorphous $SiO_2$, an amorphous SiOx and an amorphous $TiO_2$ is selected as the second constituent material. Here, according to the present embodiment, the amorphous Si is used as the second constituent material.

Further, the heat transfer layer 1 has a multilayered structure comprising the heat transfer layers 2 and the strain relaxation layers 3 stacked alternately and iteratively as a plurality of times on the silicon substrate 4, and then the strain relaxation layer 3 is formed at the top layer. That is to say, according to the heat transfer layer 1, there is provided a configuration that the heat transfer layer 2 is inserted into between the strain relaxation layers 3, for improving an inner layer heat conductivity of the heat transfer layer 2.

For improving a heat conductivity in an in-plane direction according to the heat transfer layer 1 comprising the configuration, the following conditions are required. First, it is necessary to select an optimum combination between a heat conducting material (a first constituent material) for improving a heat transfer characteristics in the in-plane direction (the right and left direction in FIG. 1), and a material (a second constituent material) for relaxing a strain thereof. Second, it is necessary to optimize a configuration of a layer thickness in the case where it is a multilayered layer.

According to the present embodiment, a graphite (C) is selected as the first constituent material for fulfilling the condition described above. In the case of the graphite, it is possible to obtain a high heat conductivity as between 1500 and 2000 W/mK for an HOPG (a high oriented pyrolytic graphite) which is superior in crystallinity.

Moreover, it is possible to obtain further high heat transfer characteristics as 3000 W/mK due to a nano carbon, since a mean free path of the phonon becomes longer due to the lower dimensional structuring. Therefore, it is possible to expect the similar effect, by lower dimensional structuring with the graphite as a thinner layer.

However, it is hard to obtain a sufficient heat conductivity only with the graphite as a thinner layer. It is known that there is a relation between crystallinity assessed by a Raman spectroscopy and a heat conductivity in the in-plane direction. Here, a full width at half maximum of the G peak in a Raman spectrum becomes an index of the assessment for the crystallinity of the graphite, and then the crystallinity thereof is better corresponding to the full width at half maximum thereof as narrower. Moreover, it is known that the inner layer heat conductivity thereof is higher corresponding to the full width at half maximum of the G peak thereof as narrower, that is to say, the crystallinity thereof as better. Therefore, it is indispensable to improve the crystallinity of the graphite in the case of the thinner layer thereof, for improving the heat conductivity thereof in in-plane direction.

Next, for improving the crystallinity of the graphite with a small thickness, it is necessary to insert the strain relaxation layer 3 comprised of the second constituent material for relaxing the strain of the graphite crystal into between the heat transfer layers 2 comprised of the first constituent material. It is considered that there is existed the optimum value for the configuration of a layer thickness because of the following reasons.

In the case where the ratio of the first constituent material (the graphite) is excessively little, not only the material for transferring heat decreases, but also it is unable to expect an improvement of the crystallinity thereof due to an insufficient relaxation of the strain thereof, and then it becomes hard to improve the heat conductivity in in-plane direction of the heat transfer layer 2.

In the case where the ratio of the first constituent material (the graphite) is excessively large, the crystallinity of the graphite becomes worse, and then it becomes hard to improve the heat conductivity in in-plane direction of the heat transfer layer 2.

Due to the reasons, ratios of a layer thickness d of the heat transfer layer 2 and a layer thickness t of the strain relaxation layer 3 are set according to the present embodiment, for fulfilling the following Formula (1) regarding the relation between the layer thickness d of the heat transfer layer 2 and the layer thickness t of the strain relaxation layer 3.

$$0.4 \leq d/(d+t) \leq 0.8 \quad (1)$$

More preferably, the ratio of the layer thickness d of the heat transfer layer 2 is set for fulfilling the following Formula (2) regarding the relation between the layer thickness d of the heat transfer layer 2 and the layer thickness t of the strain relaxation layer 3.

$$0.5 \leq d/(d+t) \leq 0.7 \quad (2)$$

A range set by the Formula (1) is a range X as shown in FIG. 2. Moreover, a range set by the Formula (2) is a range Y as shown in FIG. 2.

Moreover, the layer thickness d of the heat transfer layer 2 and the layer thickness t of the strain relaxation layer 3 are set within a range of not thinner than 1 nm but not thicker than 20 nm respectively. More preferably, the layer thickness d of the heat transfer layer 2 and the layer thickness t of the strain relaxation layer 3 are set within a range of not thinner than 3 nm but not thicker than 15 nm respectively.

Regarding the heat transfer layer 1 according to the present embodiment, the strain relaxation layer 3 is formed on the substrate 4 or on a semiconductor device formed on the substrate 4, and then the heat transfer layer 2 and the strain relaxation layer 3 are formed alternately and iteratively in the order as one time or a plurality of times. In such a case, it may be not required to form the strain relaxation layer 3 on the substrate 4 or on the semiconductor device formed on the substrate 4. However, by forming the strain relaxation layer 3 on the substrate 4 or on the semiconductor device formed on the substrate 4, an adhesion is improved between the substrate 4 or the semiconductor device formed on the substrate 4 and the heat transfer layer 2, and then it is possible to improve further the inner layer heat conductivity of the heat transfer layer. Here, as a method for forming the heat transfer layer 1, it is available to use such as an ion beam spattering method, an ion cluster beam spattering method, an MBE (a molecular beam epitaxy) method, or the like.

Next, an example of the heat transfer layer 1 according to the first embodiment will be described in detail below, based on the following Table 1 and FIG. 2.

For the heat transfer layer 1 according to the Examples 1 to 6 as shown in Table 1, a graphite (C) is used as a first constituent material of the heat transfer layer 2, and an amorphous Si is used as a second constituent material of the strain relaxation layer 3, respectively.

According to Example 1, a Si/C configuration is 7 nm/7 nm. That is to say, the layer thickness t of the strain relaxation layer 3 (the layer thickness of the second constituent material: Si layer thickness) is 7 nm, and the layer thickness d of the heat transfer layer 2 (the layer thickness of the first constituent material: C layer thickness) is 7 nm.

In Example 2, the Si/C configuration is 5 nm/7 nm. In Example 3, the Si/C configuration is 3 nm/7 nm. In Example 4, the Si/C configuration is 5 nm/5 nm. In Example 5, the Si/C configuration is 10 nm/10 nm. In Example 6, the Si/C configuration is 12 nm/12 nm.

Moreover, a ratio of the first constituent material in Table 1 is the (d/(d+t)) as the ratio of the layer thickness d of the heat transfer layer 2 (the C layer thickness) corresponding to the layer thickness (d+t) as the layer thickness in total for the heat transfer layer 2 and the strain relaxation layer 3 stacked one time as one cycle.

A manufacturing method for the heat transfer layer 1 according to the individual Examples 1 to 6 will be described in detail below.

The heat transfer layer 2 and the strain relaxation layer 3 are formed onto the single crystal Si(111) substrate 4 using the ion beam spattering method. First, the strain relaxation layer 3 comprised of an amorphous Si (the second constituent material) is formed on the Si substrate 4. Next, the heat transfer layer 2 comprised of a graphite C (the first constituent material) and the strain relaxation layer 3 comprised of the amorphous Si are formed alternately. And then at the last step, the strain relaxation layer 3 is formed at the top layer.

Heat transfer characteristics are measured regarding the Examples 1 to 6 manufactured in the process described above.

The heat transfer characteristics in a layer thickness direction are measured by performing a thermo-reflectance method. After depositing Mo onto a sample surface, heating is performed by irradiating a pulsed laser to a central part of the sample. A spot diameter of the heating laser is between 3 mm and 7 mm. According to the thermo-reflectance method, a laser for heating and a laser for detecting are irradiated at the same place, a phase lag of a thermal wave in the layer thickness direction is measured, and then a heat conductivity in the layer thickness direction is evaluated.

In the embodiment, the heat transfer characteristics in the in-plane direction are measured with the thermo-reflectance method with spacing a distance r between an irradiation spot center of the laser for heating and that of the laser for detecting. And then the evaluated inner layer heat conductivity and the evaluated heat conductivity in the layer thickness direction are shown in Table 1.

TABLE 1

| | Si/C Configuration | First constituent material C layer thickness d (nm) | Second constituent material Si layer thickness t (nm) | Rate of first constituent material d/(d + t) | Inner layer heat conductivity (W/mK) | Heat conductivity in layer thickness direction (W/mK) | Anisotropic heat transfer ratio |
|---|---|---|---|---|---|---|---|
| Example 1 | 7 nm/7 nm | 7 | 7 | 0.5 | 945 | 2.3 | 410.9 |
| Example 2 | 5 nm/7 nm | 7 | 5 | 0.58 | 1593 | 1.59 | 1001.9 |
| Example 3 | 3 nm/7 nm | 7 | 3 | 0.7 | 1014 | 2.23 | 454.7 |
| Example 4 | 5 nm/5 nm | 5 | 5 | 0.5 | 985 | 2.4 | 410.4 |
| Example 5 | 10 nm/10 nm | 10 | 10 | 0.5 | 954 | 2.45 | 389.4 |
| Example 6 | 12 nm/12 nm | 12 | 12 | 0.5 | 1014 | 2.86 | 354.5 |

From the inner layer heat conductivity and the heat conductivity in the layer thickness direction as shown in Table 1, the relation between the ratio of the first constituent material corresponding to the layer thickness (d+t) as the one cycle, that is to say, the (d/(d+t)) as the ratio of the layer thickness d of the heat transfer layer 2 (the C layer thickness) corresponding to the layer thickness (d+t) as the one cycle and the heat conductivity in the in-plane direction is shown as a curved line 10 in FIG. 2 and FIG. 3.

A measurement point (A) on the curved line 10 indicates the heat conductivity in in-plane direction regarding Example 2 with the ratio of the first constituent material as 0.58. A measurement point (B) indicates the heat conductivity in in-plane direction regarding Example 3 with the ratio of the first constituent material as 0.70. A measurement point (C) indicates the heat conductivity in in-plane direction regarding Example 1 with the ratio as 0.50. A measurement point (D) indicates the heat conductivity in in-plane direction regarding Example 5 with the ratio as 0.50. A measurement point (E) indicates the heat conductivity in in-plane direction regarding Example 4 with the ratio as 0.50. And a measurement point (F) indicates the heat conductivity in in-plane direction regarding Example 6 with the ratio as 0.50.

It becomes clear from the curved line 10 shown in FIG. 2 and FIG. 3 that it is not good in the case where the ratio of the layer thickness of the first constituent material (the graphite C), that is to say, the layer thickness d of the heat transfer layer 2 (the C layer thickness) corresponding to the layer thickness (d+t) is large, but that there is existed the optimum value. The second constituent material (Si) of the strain relaxation layer 3 relaxes the strain of the first constituent material (the graphite) of the heat transfer layer 2.

In the case where the heat transfer layer 2 (the graphite layer) is excessively thin which is shown in FIG. 4(C), it is difficult to improve the crystallinity of the heat transfer layer 2 (the graphite layer), because another Si layer cannot help but be formed before relaxing the strain of the graphite layer after a nuclear of graphite is generated directly on the strain relaxation layer 3 (the Si layer) as a graphite nucleation layer 11 is generated (refer to arrows 12 and 13). A narrower arrow indicates a lower crystallinity of the graphite, and a wider arrow indicates a higher crystallinity of the graphite, shown in FIGS. 4(A) to 4(D).

Moreover, as shown in FIG. 4(B), in the case where the heat transfer layer 2 (the graphite layer) is formed thicker than the case in FIG. 4(C), an in-plane high oriented graphite layer 15 (a layer that a wide arrow 15a exists) is formed on a graphite nucleation layer 14 (a layer that a narrow arrow 14a exists) due to relaxing the strain thereof, and then the crystallinity of the graphite becomes higher regarding the heat transfer layer 2.

On the contrary, in the case where the heat transfer layer 2 (the graphite layer) is excessively thick which is shown in FIG. 4(A) in, a disorder (a disorder 19 of a graphite plane crystal which is shown as in FIG. 4(A)) cannot help but be generated again at the period of accumulating graphite on an graphite layer 18 (a graphite plane high oriented layer) to be high oriented once on a graphite nucleation layer 17. Hence, it is considered that the crystallinity of the graphite layer cannot help but be worse again.

Thus, it is considered that there is existed the optimum value regarding the ratio of the layer thickness d of the heat transfer layer 2 (the C layer thickness) corresponding to the layer thickness (d+t).

Moreover, a ratio of high orientation of graphite is increased due to the optimization of the layer thickness t of the strain relaxation layer 3 in the case shown in FIG. 4(B) (refer to a wide arrow 16 as shown in FIG. 4(D)).

Because of the reasons, according to the first embodiment, the ratio of the layer thickness d of the heat transfer layer 2 is set for fulfilling the Formula (1) regarding the relation between the layer thickness d of the heat transfer layer 2 and the layer thickness t of the strain relaxation layer 3.

More preferably, the ratio of the layer thickness d of the heat transfer layer 2 is set for fulfilling the Formula (2) regarding the relation between the layer thickness d of the heat transfer layer 2 and the layer thickness t of the strain relaxation layer 3.

Further, according to the first embodiment, the layer thickness d of the heat transfer layer 2 and the layer thickness t of the strain relaxation layer 3 are set within the range of not thinner than 1 nm but not thicker than 20 nm respectively, according to the results of Examples 1 to 6 as shown in Table 1. Furthermore, it is preferable to set the layer thickness d of the heat transfer layer 2 and the layer thickness t of the strain relaxation layer 3 within the range of not thinner than 3 nm but not thicker than 15 nm respectively.

According to the first embodiment configured in such a way, it is possible to improve the crystallinity of the first constituent material and to improve the inner layer thermal conductivity thereof, by forming the heat transfer layer 1, with stacking the heat transfer layer 2 comprised of the first constituent material as the material including C (carbon) for transferring heat in in-plane direction and in the layer thickness direction and the strain relaxation layer 3 comprised of the second constituent material for relaxing the strain of the first constituent material.

Thus, it is possible to obtain the heat transfer layer 1 as the layer of extremely thin and having the thermal conductivity of extremely high in in-plane direction. Therefore, it is possible to realize the heat transfer layer 1 by which it becomes possible to radiate and transport efficiently with space saving regarding the heat generated by the heating element.

Because of taking heat out from an edge part of the heat transfer layer 1, it is possible to use efficiently the waste heat extracted from the edge part thereof. With the heat transfer layer 1, it is possible to transfer efficiently the heat generated by the electronic apparatus or electronic device.

There is less occurred the harmful effect on the equipment due to the dissipation and the diffusion of heat, or the like, at the period of the heat transfer process, because the heat dissipation and the heat diffusion are less at the period of the heat transfer process, and then because it is possible to obtain the sufficient heat transport amount in the in-plane direction.

It is possible to improve the crystallinity of the graphite and to improve the inner layer thermal conductivity thereof, by stacking the heat transfer layer 2 comprised of the first constituent material, with using the graphite including C (carbon) as the first constituent material, and the strain relaxation layer 3 comprised of the second constituent material for relaxing the strain of the heat transfer layer 2. Thus, it is possible to obtain the heat transfer layer 1 as the layer of extremely thin and having the thermal conductivity of extremely high in the in-plane direction.

It is possible to improve the heat conductivity in in-plane direction (the inner layer heat conductivity), and also possible to obtain the sufficient heat transport amount in the in-plane direction, by setting properly the number of stacking the heat transfer layer 2 and the strain relaxation layer 3. In particular, there is provided the configuration that the heat transfer layer 2 is inserted into between the strain relaxation layers 3 comprised of the second constituent material for relaxing the strain of the crystal of the first constituent material (the graphite), by stacking alternately and iteratively the heat transfer layer 2 and the strain relaxation layer 3 as a plurality of times in the multilayered layer configuration. Thus, it is possible to improve the inner layer heat conductivity thereof.

It is possible to improve the crystallinity of the first constituent material, because the strain of the heat transfer layer 2 is sufficiently relaxed by setting the ratio (d/(d+t)) within the range of not less than 0.4 but not larger than 0.8, and by performing the optimization for the configuration of the layer thickness in the case of the layer configuration to be multilayered. Thus, it is possible to obtain the heat transfer layer 1 as the layer of extremely thin and having the thermal conductivity of extremely high in in-plane direction.

It is possible to improve further the heat conductivity in in-plane direction (the inner layer heat conductivity) thereof, by setting the ratio (d/(d+t)) within the range of not less than 0.5 but not larger than 0.7, and by performing the optimization for the configuration of the layer thickness in the case of the layer configuration to be multilayered.

It is possible to improve the crystallinity of the first constituent material (a graphite for example) and to improve the inner layer heat conductivity thereof, by setting the layer thickness d of the heat transfer layer and the layer thickness t of the strain relaxation layer as within the range of not thinner than 1 nm but not thicker than 20 nm respectively.

It is possible to use efficiently for radiating heat from an electronic apparatus and a semiconductor device used for such as an electronics field, a vehicle waste heat management field, or the like, as required to transfer efficiently heat generated by a heating element. As a concrete example, it is possible to release a waste heat of a transistor by using as a transistor lower wiring layer in a semiconductor, and then it is possible to prevent from a thermal malfunction of the transistor.

It is possible to use for cooling such as a device for portable devices, or the like, for which space saving is required. It is possible to design a higher efficiency due to a thinner thermo electric device, by applying the heat transfer layer 1 to a heat receiving thermode and a heat radiating thermode of a thermo electric device. Moreover, the heat transfer layer 1 is applicable as a thermo electric device itself as well, because of having a thermal conductivity as anisotropic.

It is possible to use the heat transfer layer 1 as a planar high heat conducting material to transport heat, to use a waste heat, or the like, with space saving, because it is possible to exhaust the heat at an object place by transporting it thereto without releasing directly outward the heat generated from a conducting body.

Second Embodiment

Figure 5:
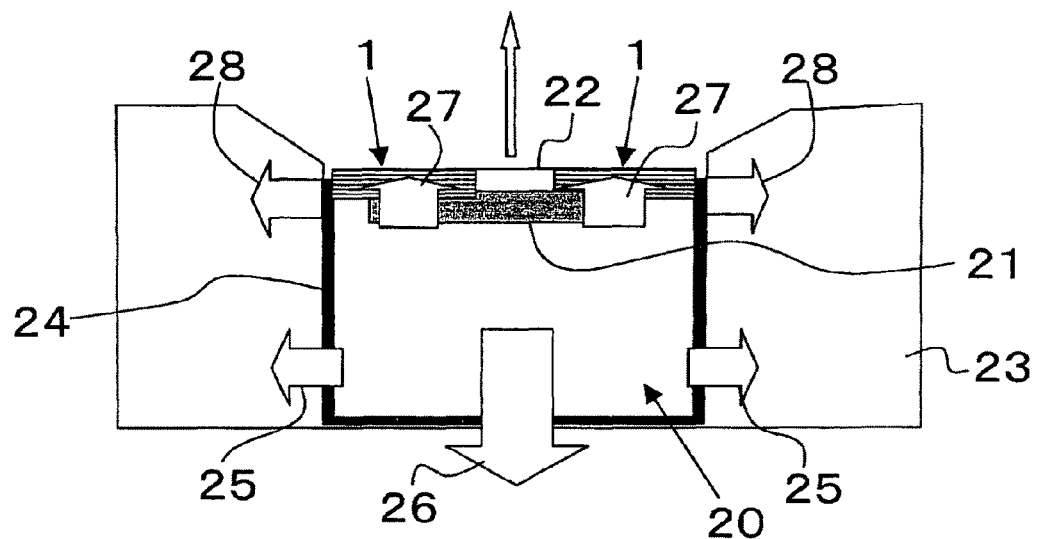
FIG. 5 is a cross sectional view showing a configuration of a semiconductor device according to a second embodiment of the present invention.
Figure 6:
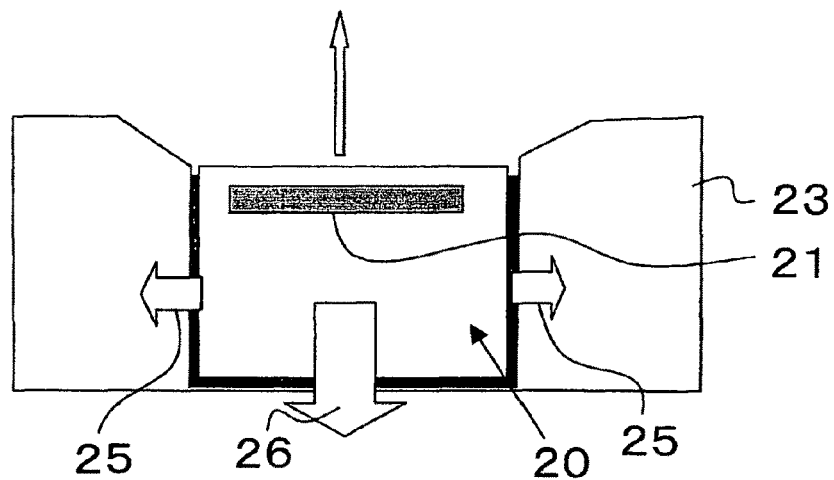
FIG. 6 is a cross sectional view showing a configuration of a conventional semiconductor device as a comparative example.

FIG. 5 is a cross sectional view showing a configuration of a semiconductor device according to the second embodiment of the present invention, and FIG. 6 is a cross sectional view showing a configuration of a conventional semiconductor device as a comparative example. Here, a duplicated description is omitted with using a similar symbol for the similar component part regarding FIG. 5 and FIG. 6.

According to the semiconductor device as shown in FIG. 5, the heat transfer layer 1 as shown in FIG. 1 is formed in the most vicinity of an active layer 21 in an LED (a light emitting diode) chip 20 as a semiconductor light emitting element. More specifically, the heat transfer layer 1 is provided at a peripheral part of a light transmission part 22 existing in the most vicinity of the active layer 21 in the LED chip 20.

Light emitted from the active layer 21 of the LED chip 20 is transmitted through the light transmission part 22 and then output outward. Here, the silicon substrate (not shown in the figure) of the heat transfer layer 1 is fixed at a position not to obstruct the outgoing beam from the active layer 21 as somewhere around the light transmission part 22 on a light output surface of the LED chip 20. The heat transfer layer 1 may be a ring shaped one, or may be an aggregate of a plurality of the heat transfer layers having a rectangular shape.

Moreover, a slag and a substrate are arranged at a bottom surface side of the LED chip 20, that are omitted in the figure, and then a slag 23 is arranged at a side face of the LED chip 20. Further, a nano-junction part 24 comprised of nano-particles is formed at the side face and the bottom surface of the LED chip 20 respectively, for suppressing a thermal contact resistance to the slag 23 and to the slag at the bottom surface side (omitted in the figure). Furthermore, a side face of the heat transfer layer 1 is contacted to the slag 23 via the nano-junction part 24 as well.

According to the semiconductor device comprising the configuration, the heat from the active layer 21 of the LED chip 20 is radiated to the slag 23 via the nano-junction part 24 with a heat flow (a path) as indicated by an arrow 25, and also radiated to the slag at the bottom surface side and the substrate (omitted in the figure) via the nano-junction part 24 with a heat flow as indicated by an arrow 26.

In the embodiment, the heat from the active layer 21 is transferred to the heat transfer layer 1 with a heat flow (a path) as indicated by an arrow 27, and transported to an edge part (a side face) side thereof by the heat transfer layer 1, and then it is radiated to the slag 23 via the nano-junction part 24 with a heat flow as indicated by an arrow 28.

According to the second embodiment configured in such a way, the heat radiation amount as total increases, and it is possible to reduce the semiconductor device temperature, because it is possible to transport preferentially the heat in the vicinity of the active layer 21 (in the vicinity of a light emitting face) to the side face by using the heat transfer layer 1. On the contrary, according to the conventional semiconductor device as shown in FIG. 6, an exhaust heat from the active layer 21 is not performed sufficiently, due to radiating heat to a center of heat flowing in a vertical direction toward the substrate or the slag side, such as the heat flow (the path) as indicated by the arrow 26.

Third Embodiment

Figure 7:
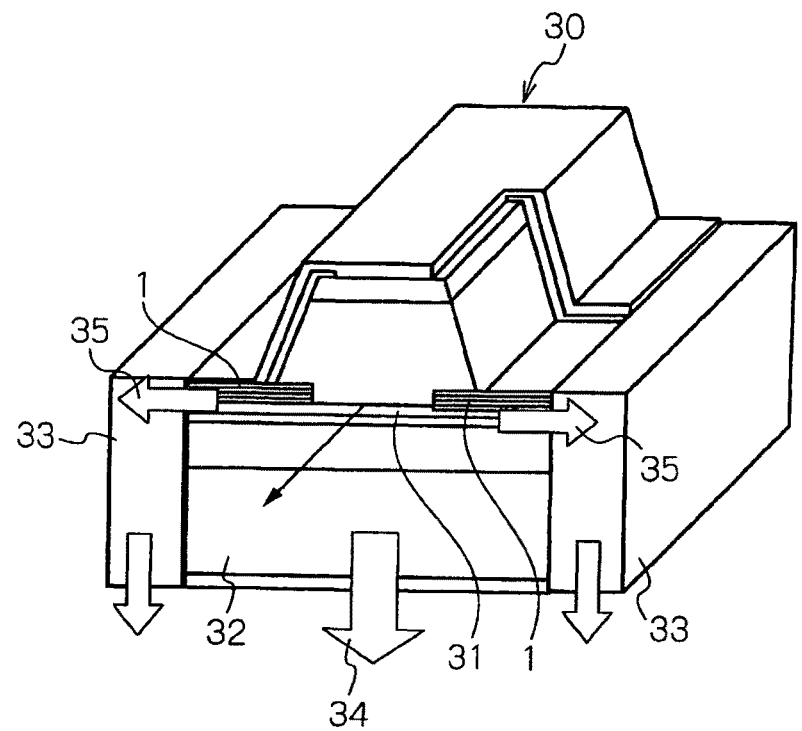
FIG. 7 is a cross sectional view showing a configuration of a semiconductor device according to a third embodiment of the present invention.
Figure 8:
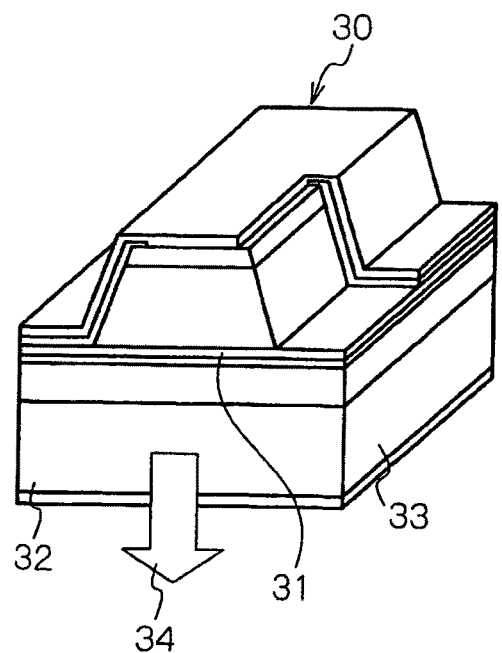
FIG. 8 is a cross sectional view showing a configuration of a conventional semiconductor device as a comparative example.

FIG. 7 is a cross sectional view showing a configuration of a semiconductor device according to the third embodiment of the present invention, and FIG. 8 is a cross sectional view showing a configuration of a conventional semiconductor device as a comparative example. Here, a duplicated description is omitted with using a similar symbol for the similar component part regarding FIG. 7 and FIG. 8.

The semiconductor device as shown in FIG. 7 is configured as a communications laser module, and FIG. 7 shows a part of the communications laser module. In a semiconductor laser diode 30 as a semiconductor light emitting element, the heat transfer layer 1 as shown in FIG. 1 is formed. More specifically, the heat transfer layer 1 is formed in the vicinity of an active layer 31 in the semiconductor laser diode 30 inside. Moreover, a symbol 32 designates an edge face at a light output side regarding edge faces of a resonator, and light generated in the active layer 31 is output from the edge face 32 at the light output side.

Further, there is provided a heat spreader (HS) 33 at a side face of the semiconductor laser diode 30. Still further, an edge face of the heat transfer layer 1 is contacted directly to the heat spreader 33, or contacted to the heat spreader 33 via a nano-junction part (omitted in the figure) for suppressing a thermal contact resistance therebetween. Furthermore, the semiconductor device as shown in FIG. 7 comprises component parts of the laser module, such as a cooling unit of a heat sink, a Peltier element, or the like, that are omitted in the figure.

According to the semiconductor device comprising the configuration, the heat from the active layer 31 of the semiconductor laser diode 30 is radiated to the heat sink, the Peltier element, or the like, that are omitted in the figure, with a heat flow (a path) as indicated by an arrow 34. The heat from the active layer 31 is transferred to the heat transfer layer 1 as well, and transported to an edge part (a side face) side thereof by the heat transfer layer 1, and then it is radiated to the heat spreader with a heat flow as indicated by an arrow 35.

According to the third embodiment configured in such a way, the heat radiation amount as total increases, and it is possible to reduce the semiconductor device temperature, because it is possible to transport preferentially the heat in the vicinity of the active layer 31 to the side face by using the heat transfer layer 1. On the contrary, according to the conventional semiconductor device as shown in FIG. 8, an exhaust heat from the active layer 31 is not performed sufficiently, due to radiating heat to a center of heat flowing in a vertical direction, such as the heat flow as indicated by the arrow 34.

Fourth Embodiment

Figure 9:
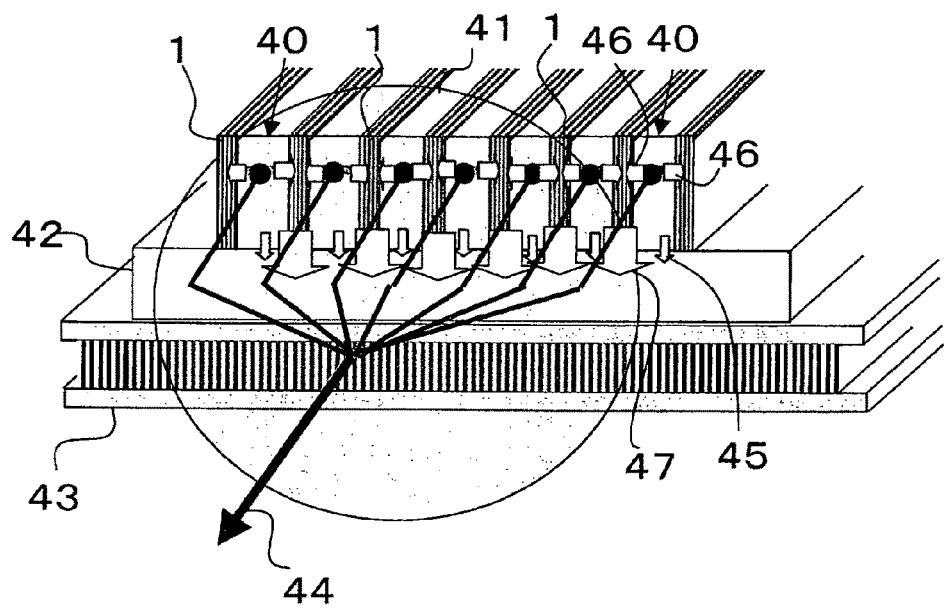
FIG. 9 is a cross sectional view showing a configuration of a semiconductor device according to a fourth embodiment of the present invention.
Figure 10:
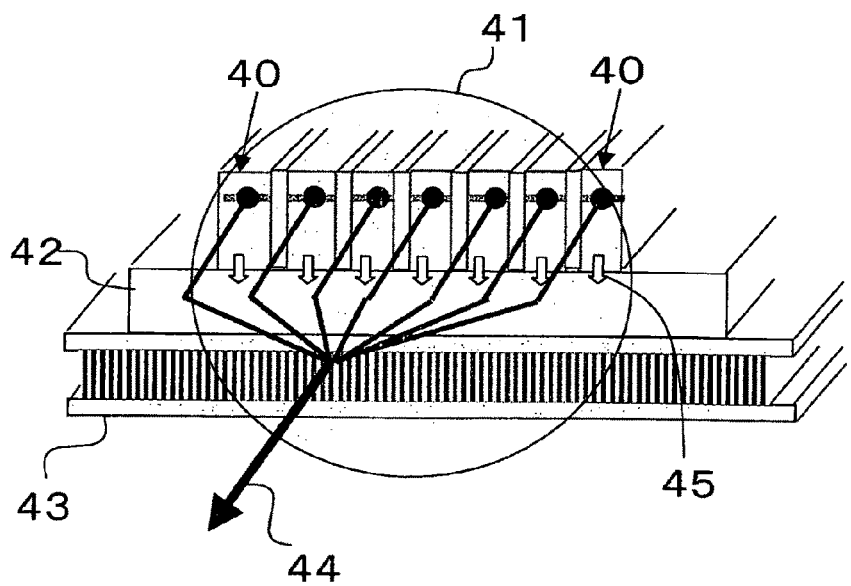
FIG. 10 is a cross sectional view showing a configuration of a conventional semiconductor device as a comparative example.

FIG. 9 is a cross sectional view showing a configuration of a semiconductor device according to the fourth embodiment of the present invention, and FIG. 10 is a cross sectional view showing a configuration of a conventional semiconductor device as a comparative example. Here, a duplicated description is omitted with using a similar symbol for the similar component part regarding FIG. 9 and FIG. 10.

The semiconductor device as shown in FIG. 9 is configured as a laser module for processing, and FIG. 9 shows a part of the laser module for processing. The semiconductor device comprises a plurality of semiconductor laser diodes 40 arranged with aligning, a condensing lens 41 for condensing outgoing beams from a plurality of the semiconductor laser diodes 40, a heat spreader 42, a Peltier element 43 as a cooling unit, and a plurality of the heat transfer layer 1 arranged for sandwiching each of a plurality of the semiconductor laser diodes 40 respectively.

The semiconductor device is configured for transporting heat from a plurality of the semiconductor laser diodes 40 and then for releasing toward the heat spreader 42 side. Here, a symbol 44 designates a laser light irradiated onto a workpiece to be laser processed, by condensing using the condensing lens 41 regarding lights output from an edge face at a light output side of the semiconductor laser diode 40.

According to the semiconductor device comprising the configuration, the heat from the active layer of the individual semiconductor laser diodes 40 is radiated to the heat spreader 42 with a heat flow (a path) as indicated by an arrow 45. The heat from the active layer of the individual semiconductor laser diodes 40 is also transferred to a plurality of the heat transfer layers 1 arranged for sandwiching the individual semiconductor laser diodes 40 with a heat flow (a path) as indicated by an arrow 46, and transported to an edge part (a side face) side thereof by the individual heat transfer layers 1, and then it is radiated to the heat spreader 42 with a heat flow as indicated by an arrow 47.

According to the fourth embodiment configured in such a way the heat radiation amount as total becomes increased, and then it is possible to reduce the semiconductor device temperature, because it is possible to transport preferentially the heat generated from the individual active layers of a plurality of the semiconductor laser diodes 40 to the side face by using a plurality of the heat transfer layers 1 arranged for sandwiching the individual semiconductor laser diodes 40.

A thermal distance becomes extremely short between the active layer of the individual semiconductor laser diodes 40 and the heat spreader 42, because the heat from the active layers of the individual semiconductor laser diodes 40 is released to the heat spreader 42 via the heat transfer layers 1 existing at the both sides of the individual semiconductor laser diodes 40. Thus, it is possible to exhaust efficiently the heat which is from the active layers of a plurality of the semiconductor laser diodes 40 that are arranged with aligning.

It is possible to suppress a decrease in luminous efficiency due to a thermal interference between the individual semiconductor laser diodes 40, because it is possible to exhaust efficiently the heat from the active layers of a plurality of the semiconductor laser diodes 40.

Fifth Embodiment

Figure 11:
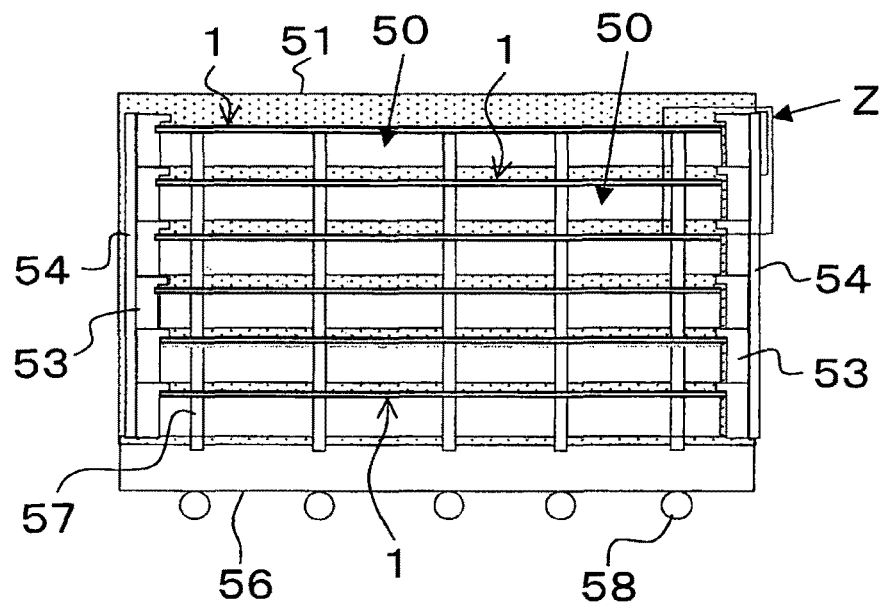
FIG. 11 is a cross sectional view showing a configuration of a semiconductor device according to a fifth embodiment of the present invention.
Figure 12:
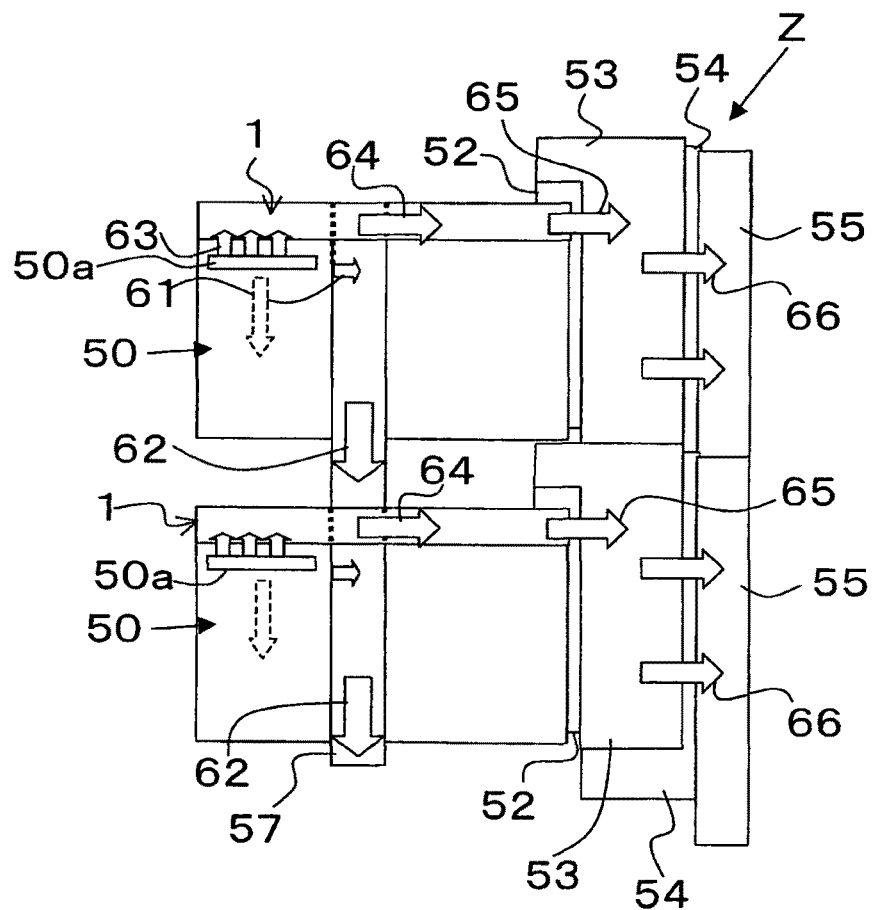
FIG. 12 is a partial cross sectional view showing with enlarging a portion Z of the semiconductor device as shown in FIG. 11.
Figure 13:
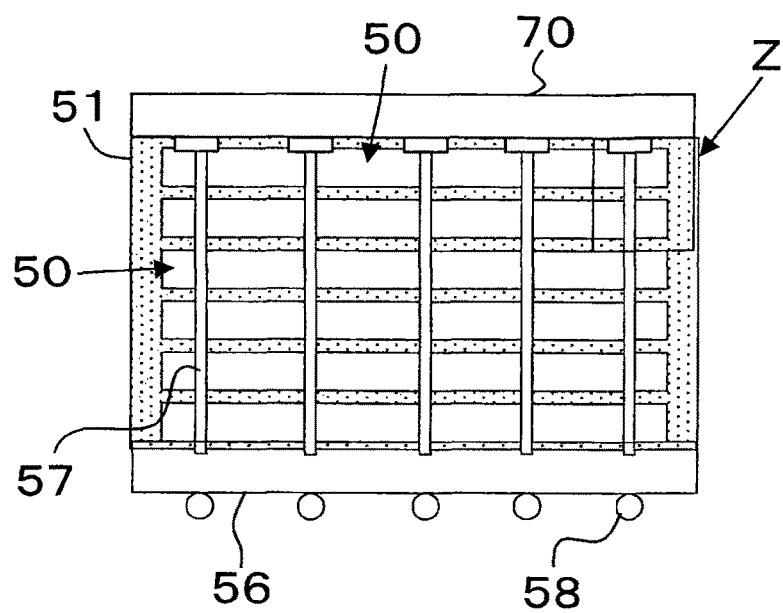
FIG. 13 is a cross sectional view showing a configuration of a conventional semiconductor device as a comparative example.
Figure 14:
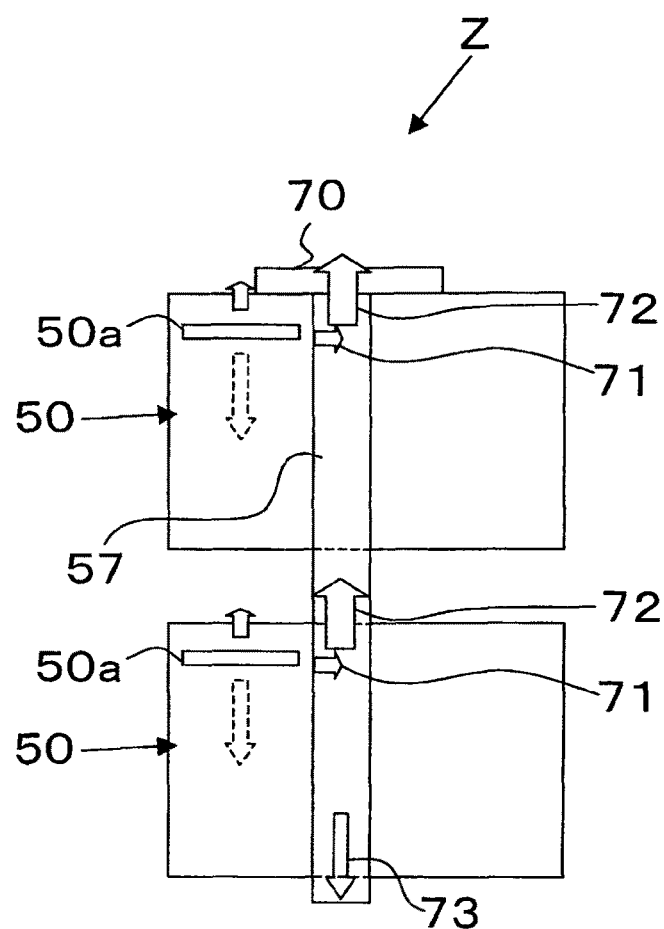
FIG. 14 is a partial cross sectional view showing with enlarging a portion Z of the semiconductor device as shown in FIG. 14.

FIG. 11 is a cross sectional view showing a configuration of a semiconductor device according to the fifth embodiment of the present invention, and FIG. 12 is a partial cross sectional view showing with enlarging a portion Z of the similar semiconductor device. FIG. 13 is a cross sectional view showing a configuration of a conventional semiconductor device as a comparative example, and FIG. 14 is a partial cross sectional view showing with enlarging a portion Z of the similar semiconductor device. Here, a duplicated description is omitted with using a similar symbol for the similar component part regarding FIG. 11 through FIG. 14.

Here, the semiconductor device as shown in FIG. 11 is configured for transporting and releasing heat from a plurality of silicon chips (Si chips) 50 as semiconductor elements to an edge part of the individual heat transfer layers 1, by using a plurality of the heat transfer layers 1. In the semiconductor device, a plurality of the silicon chips 50 are arranged with stacking at a package 51 inside, and the individual heat transfer layers 1 is formed on a top surface of the individual silicon chips 50 respectively.

Moreover, the silicon chip 50 is an electronic device including a semiconductor light emitting element, such as an LED (a light emitting diode), a semiconductor laser diode, or the like, and/or including a semiconductor element, such as a MOSFET (a metal oxide semiconductor field effect transistor), an HFET (a hetero-junction field effect transistor, or an HEMT: a high electron mobility transistor) having a GaN/AlGaN hetero-junction structure, or the like. According to the present embodiment, the silicon chip 50 is a semiconductor laser diode.

Further, at both sides of the individual silicon chips 50 and of the heat transfer layers 1 respectively, a nano-junction part 52, a heat sink 53, a nano-junction part 54, and a radiator 55 are arranged in order, as shown in FIG. 11 and FIG. 12. Furthermore, a plurality of penetration posts 57 are extended from the top layer of the heat transfer layers 1 to a substrate 56, for releasing heat generated in the individual silicon chips 50 to the substrate 56. Here, a symbol 58 designates a soldering ball.

According to the semiconductor device comprising the configuration, the heat generated in an active layer 50a of the individual silicon chips 50 is transferred to a plurality of the penetration posts 57 with a heat flow (a path) as indicated by an arrow 61, and then radiated to the substrate 56 due to the individual penetration posts 57 with a heat flow (a path) as indicated by an arrow 62, as shown in FIG. 12.

The heat generated in the active layer 50a of the individual silicon chips 50 is also transferred to the individual heat transfer layers 1 with a heat flow (a path) as indicated by an arrow 63, and transported to an edge part (a side face) side thereof by the individual heat transfer layers 1 with a heat flow (a path) as indicated by an arrow 64, and then it is radiated to the individual heat sinks 53 via the nano-junction part 52 with a heat flow as indicated by an arrow 65. Moreover, the heat conducted to the individual heat sinks 53 is transferred the individual radiators 55 via the individual nano-junction parts 54 with a heat flow as indicated by an arrow 66.

According to the fifth embodiment configured in such a way, it is possible to reduce temperatures of the whole layers of the silicon chips 50, because the heat generated in the active layer 50a of the individual silicon chips 50 is released to the substrate 56 via a plurality of the penetration posts 57, and because it is released also to the radiators 55 surrounding thereof via a plurality of the heat transfer layers 1.

On the contrary, according to a semiconductor device as shown in FIG. 13 and FIG. 14, heat generated in an active layer 50a of individual silicon chips 50 is transferred to a plurality of penetration posts 57 with a heat flow (a path) as indicated by an arrow 71. And then the heat transferred to a plurality of the penetration posts 57 is released to a cooling unit 70 (a heat pipe, a Peltier element, or the like) side at a top surface thereof via the penetration posts 57 with a heat flow as indicated by an arrow 72, and also it is released to the substrate 56 side via the penetration posts 57 with a heat flow as indicated by an arrow 73.

Hence, there is occurred limitations on a heat transfer from the active layer 50a of the individual silicon chips 50 to the individual penetration posts 57, and on a flow of heat at the individual penetration posts 57 inside. And then only the silicon chip 50 existing at an upper layer thereof and the silicon chip 50 existing at a lower layer thereof mainly become cooled down thereby. Hence, the silicon chips 50 existing in therebetween cannot help but become increased, and then it becomes difficult to reduce the temperatures of the whole layers of the silicon chips 50.

Sixth Embodiment

Figure 15:
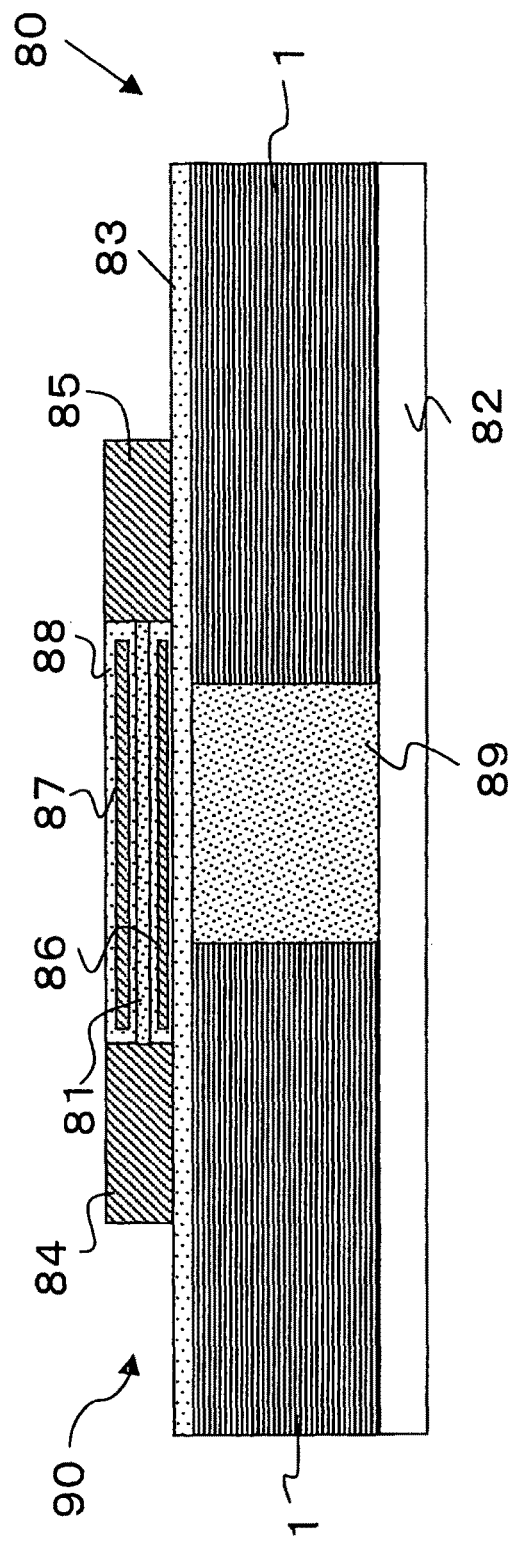
FIG. 15 is a cross sectional view showing a configuration of a transistor layer part of a semiconductor element built-in a semiconductor device according to a sixth embodiment of the present invention.

FIG. 15 is a cross sectional view showing a configuration of a transistor layer part of a semiconductor element built-in a semiconductor device according to the sixth embodiment of the present invention.

A semiconductor device 80 as shown in FIG. 15 is a semiconductor device comprising the heat transfer layer 1 as shown in FIG. 1, that is configured for transporting and releasing heat from a transistor layer 90 of the semiconductor device 80 toward in-plane direction of the heat transfer layer 1, by using the transfer layer 1.

More specifically, the semiconductor device 80 comprises a silicon (Si) substrate 82, the heat transfer layer 1 formed on the silicon substrate 82, a silicon oxide layer (SiO$_2$) 83 formed on the heat transfer layer 1, and a transistor layer 90 formed on the silicon oxide layer 83.

Further, in the transistor layer 90, a source electrode 84 and a drain electrode 85 are formed, that are ohmic contacted to both sides of a channel layer 81 respectively. Still further, gate electrodes 86 and 87 are formed at top and bottom of the channel layer 81 respectively, and then a surrounding area of the gate electrodes 86 and 87 is covered with a silicon oxide layer 88 as a gate insulating layer.

Moreover, the semiconductor device 80 further comprises a silicon (Si) layer 89 formed at a central part on the silicon substrate 82. And then according to the semiconductor device 80, the heat transfer layer 1 is formed at both sides of the silicon layer 89, for being connected to the silicon substrate 82 via the silicon layer 89.

According to the sixth embodiment configured in such a way it is possible to diffuse efficiently the heat from the transistor layer 90 of the semiconductor device 80, to reduce a temperature of the transistor layer 90, and to reduce a loss of a gate leak current or the like, because of transporting and releasing the generated heat toward in-plane direction of the heat transfer layer 1, by transferring efficiently the heat generated from the transistor layer 90 of the semiconductor device 80 to the whole of the heat transfer layer 1 via the silicon layer 89.

Seventh Embodiment

Figure 16:
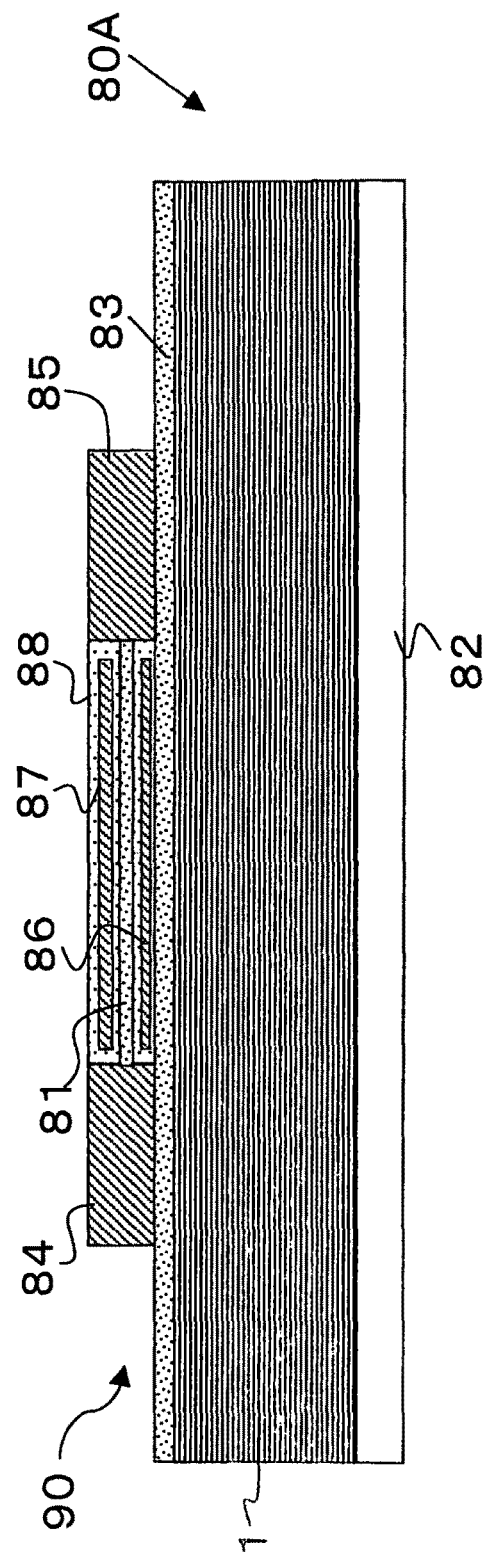
FIG. 16 is a cross sectional view showing a configuration of a transistor layer part of a semiconductor element built-in a semiconductor device according to a seventh embodiment of the present invention.

FIG. 16 is a cross sectional view showing a configuration of a transistor layer part of a semiconductor element built-in a semiconductor device according to the seventh embodiment of the present invention.

An aspect of a semiconductor device 80A as shown in FIG. 16 is characterized in that the heat transfer layer 1 is formed over a surface of the silicon substrate 82. All other configurations are similar to that in the semiconductor device 80 as shown in FIG. 15.

According to the seventh embodiment configured in such a way, it is possible to diffuse efficiently the heat from the transistor layer 90 of the semiconductor device 80A, to reduce a temperature of the transistor layer 90, and then it is possible to reduce a loss of a gate leak current or the like, because of transporting and releasing the heat generated from the transistor layer 90 of the semiconductor device 80A toward in-plane direction of the heat transfer layer 1, by using the heat transfer layer 1 formed over the surface of the silicon substrate 82.

Eighth Embodiment

Figure 17:
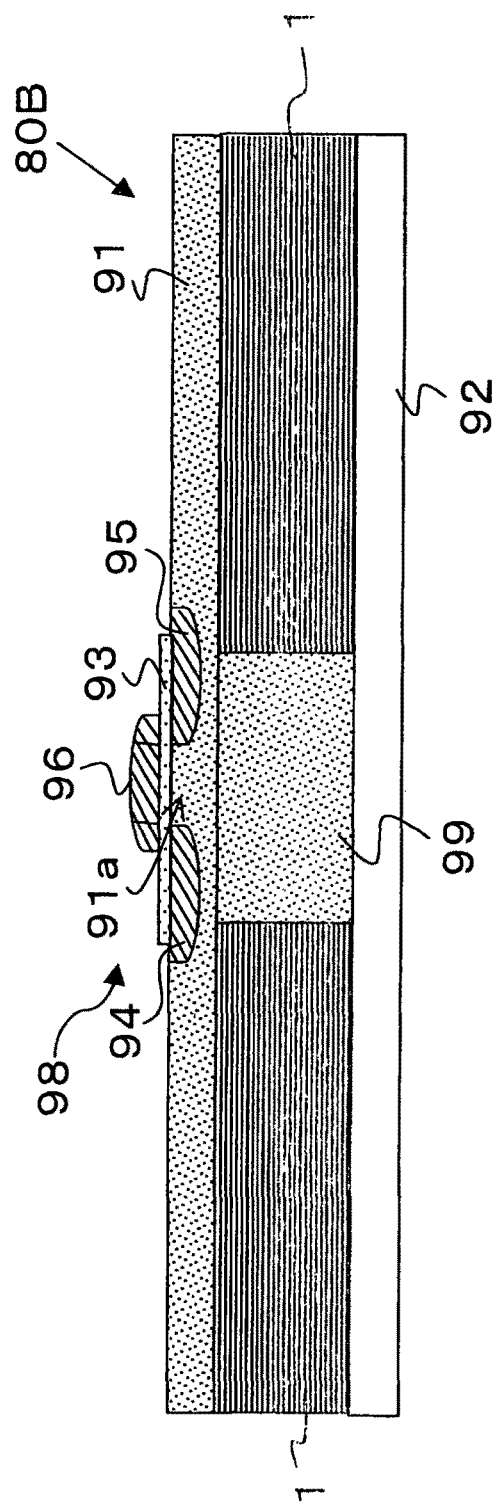
FIG. 17 is a cross sectional view showing a configuration of a transistor layer part of a semiconductor element built-in a semiconductor device according to an eighth embodiment of the present invention.

FIG. 17 is a cross sectional view showing a configuration of a transistor layer part of a semiconductor element built-in a semiconductor device according to the eighth embodiment of the present invention.

A semiconductor device 80B as shown in FIG. 17 is a semiconductor device comprising the heat transfer layer 1 as shown in FIG. 1, that is configured for transporting and releasing heat from a transistor layer 98 of the semiconductor device 80B toward in-plane direction of the heat transfer layer 1, by using the transfer layer 1.

More specifically, the semiconductor device 80B comprises a silicon (Si) substrate 92, the heat transfer layer 1 formed on the silicon substrate 92, a silicon layer 91 formed on the heat transfer layer 1, and a transistor layer 98.

Further, the transistor layer 98 is comprised of a source electrode 94 and a drain electrode 95 that are formed on the silicon layer 91, a channel 91a in a region between the source electrode 94 and the drain electrode 95, a silicon oxide layer (SiO$_2$) 93 as a gate insulating layer formed on the channel 91a, and a gate electrode 96 formed on the silicon oxide layer 93.

Moreover, the semiconductor device 80B further comprises a silicon (Si) layer 99 formed at a central part on the silicon substrate 92. And then according to the semiconductor device 80B, the heat transfer layer 1 is formed at both sides of the silicon layer 99, for being connected to the silicon substrate 92 via the silicon layer 99.

According to the eighth embodiment configured in such a way, it is possible to diffuse efficiently the heat from the transistor layer 98 of the semiconductor device 80B, to reduce a temperature of the transistor layer 98, and to reduce a loss of a gate leak current or the like, because of transporting and releasing the generated heat toward in-plane direction of the heat transfer layer 1, by transferring efficiently the heat generated from the transistor layer 98 of the semiconductor device 80B to the whole of the heat transfer layer 1 via the silicon layer 99.

Ninth Embodiment

Figure 18:
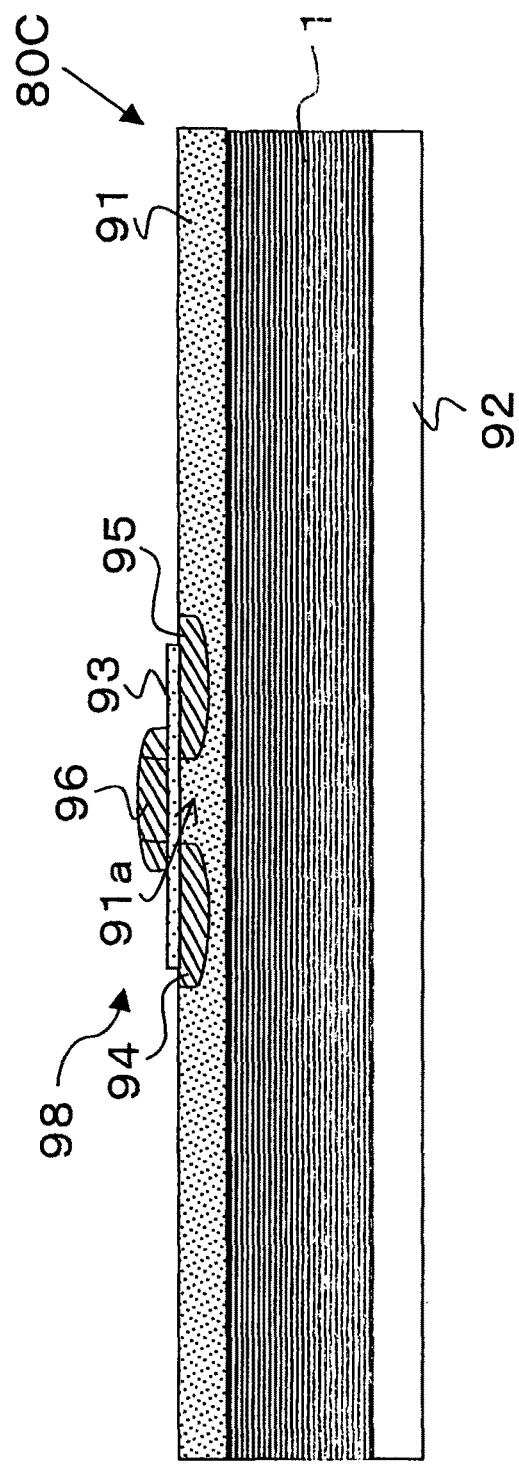
FIG. 18 is a cross sectional view showing a configuration of a transistor layer part of a semiconductor element built-in a semiconductor device according to a ninth embodiment of the present invention.

FIG. 18 is a cross sectional view showing a configuration of a transistor layer part of a semiconductor element built-in a semiconductor device according to the ninth embodiment of the present invention.

An aspect of a semiconductor device 80C as shown in FIG. 18 is characterized in that the heat transfer layer 1 is formed over a surface of the silicon substrate 82. All other configurations are similar to that in the semiconductor device 80B as shown in FIG. 17.

According to the ninth embodiment configured in such a way, it is possible to diffuse efficiently the heat from the transistor layer 98 of the semiconductor device 80C, to reduce a temperature of the transistor layer 98, and to reduce a loss of a gate leak current or the like, because of transporting and releasing the heat generated from the transistor layer 98 of the semiconductor device 80C toward in-plane direction of the heat transfer layer 1, by using the heat transfer layer 1 formed over the surface of the silicon substrate 92.

Incidentally, it is necessary to form an insulation layer under the silicon layer 91 in the conventional SOI (Si on insulator) substrate in which a thin silicon layer 91 is formed on the heat transfer layer 1. However, according to the construction of the present invention, it is not necessary to newly form an insulation layer, since the heat transfer layer 1 has insulation property itself. More specifically, when the silicon layer 91 is made thin, the heat transfer layer 1 can be used as the insulation layer. Thus, more effectively functioning to improve the operation speed and reduce the power consumption which the conventional SOI substrate inherently has.

Here, it is also possible to embody the present invention, with modifying as below. The heat transfer layer 1 as shown in FIG. 1 is not limited to the application examples, and applicable to the following electronic apparatus. To a portable electronic apparatus for which space saving is required, such as a portable telephone or the like. To an electronic apparatus in which a plurality of electronic components are arranged in a limited small space, such as a control equipment for automobiles.

The heat transfer layer according to the present invention is not limited thereto, and it is widely applicable to electronic apparatus for which heat radiation of a heating element is required to perform efficiently in a limited small space, to small sized electronic apparatus in particular. In the electronic apparatus, the heat transfer layer 1 is arranged on an electronic component, such as a semiconductor device or the like, or formed inside thereof.

What is claimed is:

1. A heat transfer film, comprising:
a first heat transfer layer laminated on a substrate, said first heat transfer layer being formed of a first constituent material containing C (carbon) for transferring heat in an in-plane direction thereof and a layer thickness direction thereof;
a first strain relaxation layer formed of a second constituent material and laminated on the first heat transfer layer;
a second heat transfer layer formed of the first constituent material and laminated on the first strain relaxation layer; and
a second strain relaxation layer formed of the second constituent material and laminated on the second heat transfer layer for relaxing a strain in the second heat transfer layer,
wherein said second heat transfer layer has a layer thickness d and said second strain relaxation layer has a layer thickness t both within a range of equal to or greater than 1 nm and equal to or smaller than 20 nm, and
said first constituent material includes a graphite and said second constituent material includes one of an amorphous Si, an amorphous Ge, an amorphous SiGe, an amorphous SiO2, an amorphous SiOx, and an amorphous TiO2.

2. The heat transfer film according to claim 1, wherein said second heat transfer layer has the layer thickness d and said second strain relaxation layer has the layer thickness t so that the following relation is established:

$$0.4 \leq d/(d+t) \leq 0.8.$$

3. A semiconductor device comprising a semiconductor element and the heat transfer film according to claim 1, said heat transfer film being formed on or in the semiconductor element inside.

4. The semiconductor device according to claim 3, wherein said semiconductor element includes an active layer disposed to contact with the heat transfer film.

5. The semiconductor device according to claim 3, wherein said semiconductor element is formed of a light-emitting diode so that the light-emitting diode emits light passing through an opening portion of the heat transfer film.

6. The semiconductor device according to claim 3, wherein said heat transfer film includes a center silicon layer penetrating therethrough so that the center silicon layer contacts with the substrate.

7. An electronic apparatus comprising an electronic device and the heat transfer film according to claim 1, said heat transfer film being formed on or in the electronic device.

* * * * *